(12) United States Patent
Fujiwara et al.

(10) Patent No.: US 11,133,435 B2
(45) Date of Patent: Sep. 28, 2021

(54) NITRIDE SEMICONDUCTOR SUBSTRATE, MANUFACTURING METHOD THEREFOR, AND SEMICONDUCTOR DEVICE

(71) Applicant: OSAKA UNIVERSITY, Suita (JP)

(72) Inventors: Yasufumi Fujiwara, Suita (JP); Wanxin Zhu, Suita (JP); Atsushi Koizumi, Suita (JP); Brandon Mitchell, Suita (JP); Tom Gregorkiewicz, Suita (JP)

(73) Assignee: OSAKA UNIVERSITY, Suita (JP)

( * ) Notice: Subject to any disclaimer, the term of this patent is extended or adjusted under 35 U.S.C. 154(b) by 340 days.

(21) Appl. No.: 16/463,765

(22) PCT Filed: Nov. 20, 2017

(86) PCT No.: PCT/JP2017/041686
§ 371 (c)(1),
(2) Date: May 23, 2019

(87) PCT Pub. No.: WO2018/097102
PCT Pub. Date: May 31, 2018

(65) Prior Publication Data
US 2019/0280156 A1  Sep. 12, 2019

(30) Foreign Application Priority Data
Nov. 25, 2016 (JP) .............................. JP2016-229410

(51) Int. Cl.
*H01L 33/12* (2010.01)
*C30B 29/40* (2006.01)
(Continued)

(52) U.S. Cl.
CPC .............. *H01L 33/12* (2013.01); *C23C 16/34* (2013.01); *C30B 25/02* (2013.01); *C30B 29/38* (2013.01);
(Continued)

(58) Field of Classification Search
CPC ........................... C23C 16/34; H01L 21/0242; H01L 21/02389
See application file for complete search history.

(56) References Cited

U.S. PATENT DOCUMENTS

| | | |
|---|---|---|
| 2005/0106883 A1 | 5/2005 | Sasaki et al. |
| 2007/0072320 A1 | 3/2007 | Frayssinet et al. |

(Continued)

FOREIGN PATENT DOCUMENTS

| | | |
|---|---|---|
| CN | 102244171 A | 11/2011 |
| JP | 2003-257854 A | 9/2003 |

(Continued)

OTHER PUBLICATIONS

Korean Notice of Final Rejection for Korean Application No. 10-2019-7017620, dated Nov. 16, 2020, with an English translation.
(Continued)

*Primary Examiner* — Mounir S Amer
(74) *Attorney, Agent, or Firm* — Birch, Stewart, Kolasch & Birch, LLP

(57) ABSTRACT

Provided is a technique for manufacturing a nitride semiconductor substrate with which it is possible to manufacture a nitride semiconductor substrate having sufficiently reduced dislocation density with a large area even if manufactured on an inexpensive substrate made of sapphire, etc. A nitride semiconductor substrate in which a nitride semiconductor layer formed on a substrate is formed by laminating an undoped nitride layer and a rare earth element-added nitride layer to which a rare earth element is added as a doping material, and the dislocation density is of the order of 106 cm−2 or less. A method for manufacturing a nitride semiconductor substrate in which a step for growing GaN, InN, AlN, or a mixed crystal of two or more thereof on a substrate to form an undoped nitride layer, and a step for forming a rare earth element-added nitride layer to which a rare earth element is added so as to be substituted for Ga, In, (Continued)

or Al are performed via a series of formation steps using an organic metal vapor epitaxial technique at a temperature of 900 to 1200° C. without extraction from a reaction vessel.

20 Claims, 7 Drawing Sheets

(51) Int. Cl.

| | | |
|---|---|---|
| C30B 25/02 | (2006.01) | |
| C23C 16/34 | (2006.01) | |
| H01L 29/15 | (2006.01) | |
| H01L 29/20 | (2006.01) | |
| H01L 33/04 | (2010.01) | |
| H01L 33/00 | (2010.01) | |
| H01L 21/02 | (2006.01) | |
| H01L 33/32 | (2010.01) | |
| H01L 21/205 | (2006.01) | |
| C30B 29/38 | (2006.01) | |
| H01S 5/323 | (2006.01) | |

(52) U.S. Cl.
CPC ........ *C30B 29/403* (2013.01); *H01L 21/0242* (2013.01); *H01L 21/0254* (2013.01); *H01L 21/0262* (2013.01); *H01L 21/02378* (2013.01); *H01L 21/02381* (2013.01); *H01L 21/02389* (2013.01); *H01L 21/02458* (2013.01); *H01L 21/02507* (2013.01); *H01L 21/205* (2013.01); *H01L 29/157* (2013.01); *H01L 29/2003* (2013.01); *H01L 33/007* (2013.01); *H01L 33/04* (2013.01); *H01L 33/32* (2013.01); *H01S 5/323* (2013.01)

(56) References Cited

U.S. PATENT DOCUMENTS

| | | | |
|---|---|---|---|
| 2009/0278136 A1 | 11/2009 | Beaumont et al. | |
| 2010/0001289 A1 | 1/2010 | Frayssinet et al. | |
| 2010/0252835 A1 | 10/2010 | Horie et al. | |
| 2011/0198610 A1 | 8/2011 | Fujikura | |
| 2012/0077299 A1* | 3/2012 | Nishikawa | H01L 33/007 438/46 |
| 2014/0318441 A1 | 10/2014 | Horie et al. | |

FOREIGN PATENT DOCUMENTS

| | | |
|---|---|---|
| JP | 2005-298291 A | 10/2005 |
| JP | 2009-519198 A | 5/2009 |
| JP | 2009-147319 A | 7/2009 |
| JP | 2009-212308 A | 9/2009 |
| JP | 2010-199620 A | 9/2010 |
| JP | 2011-162407 A | 8/2011 |
| JP | 2012-232884 A | 11/2012 |
| JP | 2015-095585 A | 5/2015 |
| JP | 2015-151291 A | 8/2015 |
| WO | WO 2010/128643 A1 | 11/2010 |

OTHER PUBLICATIONS

Extended European Search Report for European Application No. 17873866.2, dated Nov. 5, 2019.
Tawil et al., "Synthesis and Characterization of Gd-doped InGaN Thin Films and Superlattice Structure," Nanoelectronics Conference (INEC), 2010 3rd International, IEEE, Piscataway, NJ, USA, XP031645147, pp. 1163-1164.
Korean Office Action, dated May 28, 2020, for Korean Application No. 10-2019-7017620, along with an English translation.
W. Zhu et al., "High-Power Eu-Doped GaN Red LED Based on a Multilayer Structure Grown at Lower Temperatures by Organometallic Vapor Phase Epitaxy," MRS Advances © 2017 Materials Research Society, 1557, 2017, pp. 159-164.
Ban et al., "Internal Quantum Efficiency of Whole-Composition-Range AlGaN Multiquantum Wells", Applied Physics Express, vol. 4, 2011, pp. 052101-1-052101-3.
International Preliminary Report on Patentability (PCT/IPEA/409) issued in PCT/JP2017/041686, dated Nov. 5, 2018.
International Search Report (PCT/ISA/210) issued in PCT/JP2017/041686, dated Feb. 20, 2018.
Mitchell et al., "Utilization of native oxygen in Eu(RE)-doped GaN for enabling device compatibility in optoelectronic applications", Scientific Reports, vol. 6, No. 18808, Jan. 4, 2016, 8 pages.
Written Opinion (PCT/ISA/237) issued in PCT/JP2017/041686, dated Feb. 20, 2018.
Written Opinion of the International Preliminary Examining Authority (PCT/IPEA/408) issued in PCT/JP2017/041686, dated Aug. 14, 2018.
Chinese Office Action, dated Apr. 6, 2021, for Chinese Application No. 201780072551.0, along with an English translation.
Chinese Office Action, dated Aug. 18, 2020, for Chinese Application No. 201780072551.0, along with an English translation.

* cited by examiner

[Fig. 1]
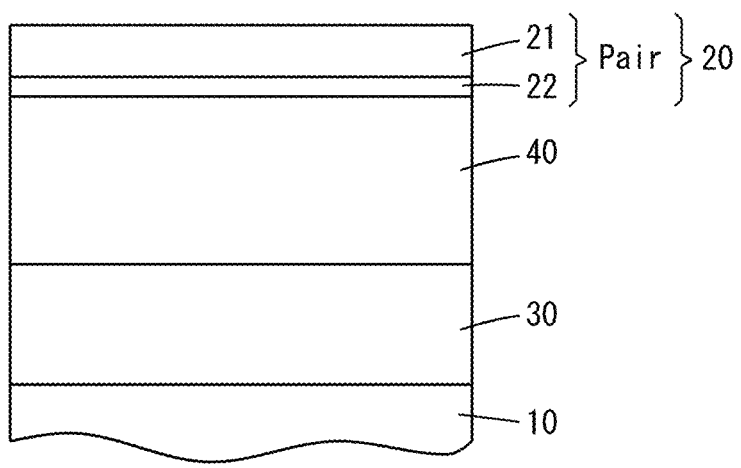

[Fig. 2]
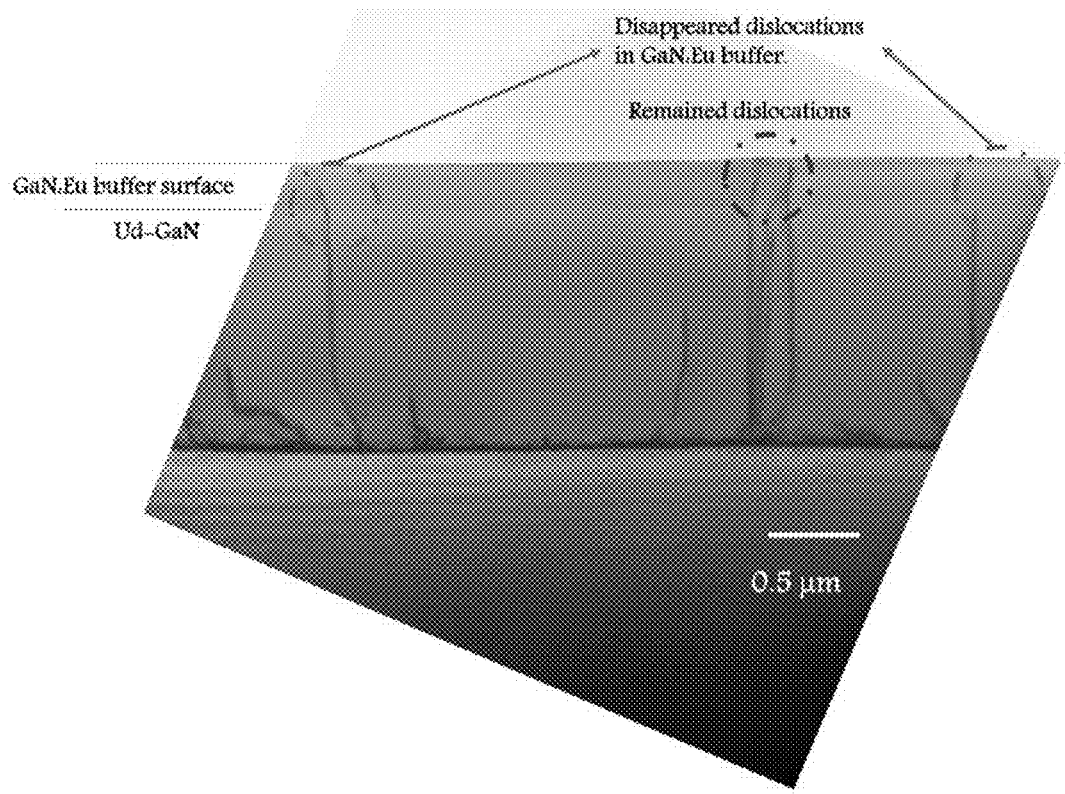
[Fig. 3]
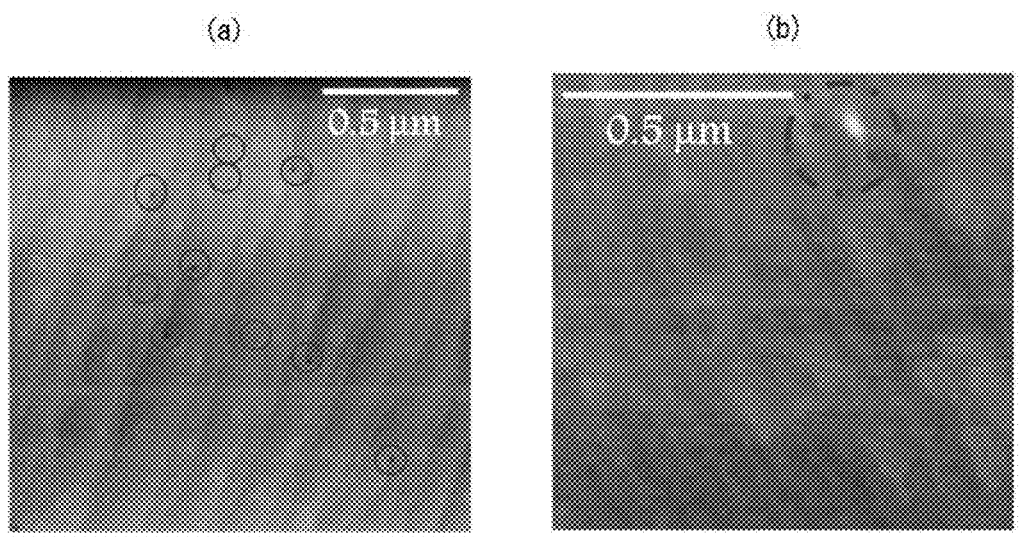

[Fig. 4]
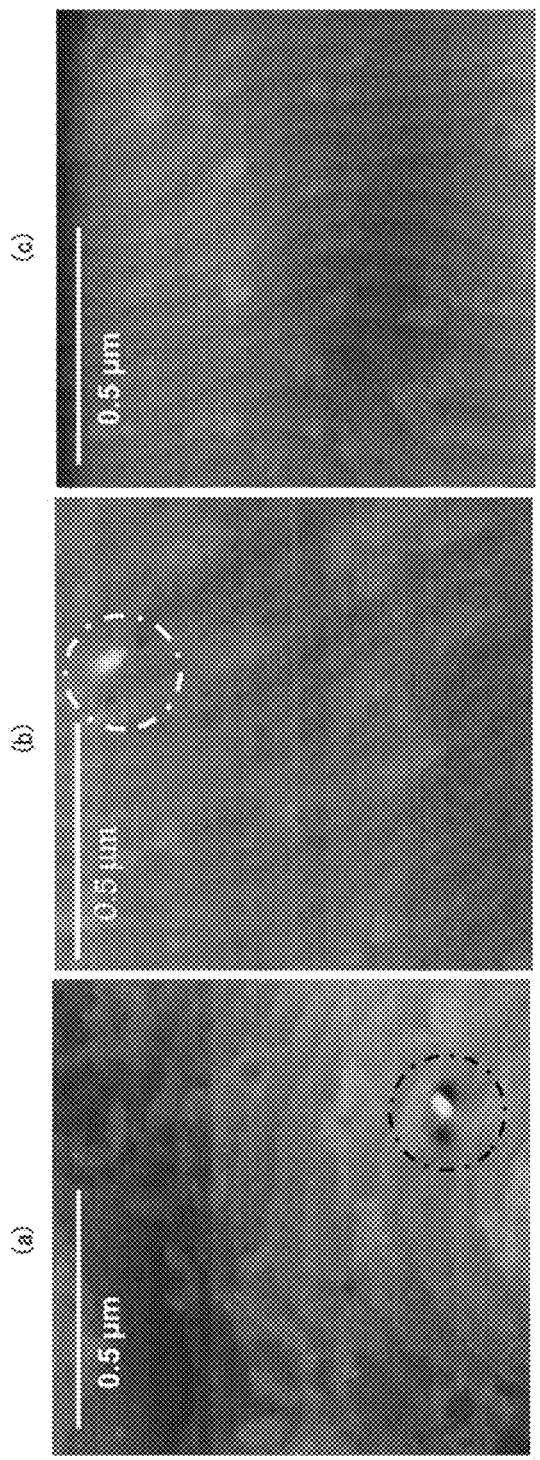

[Fig. 5]
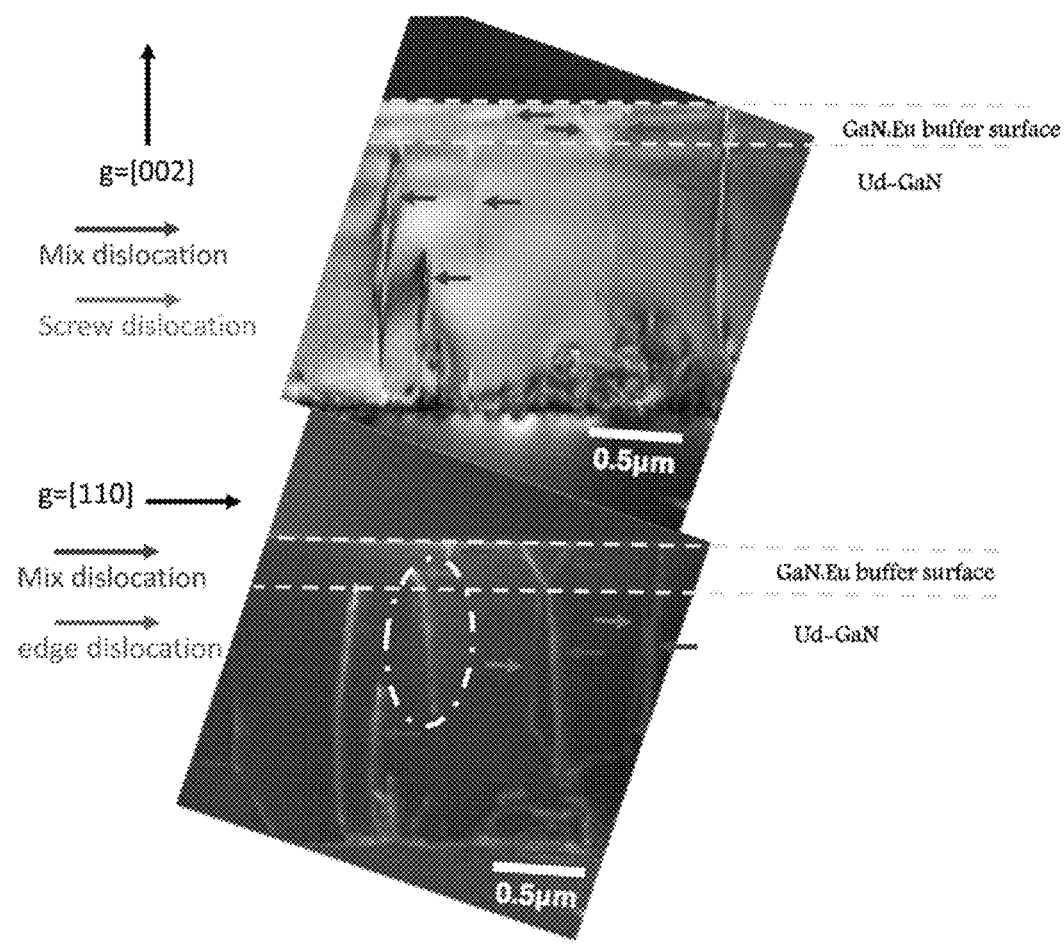

[Fig. 6]
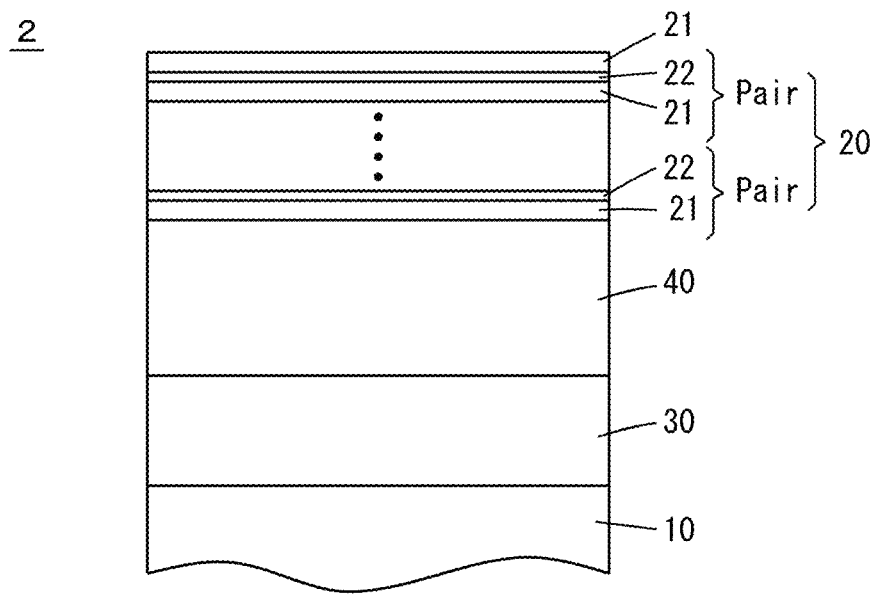
[Fig. 7]
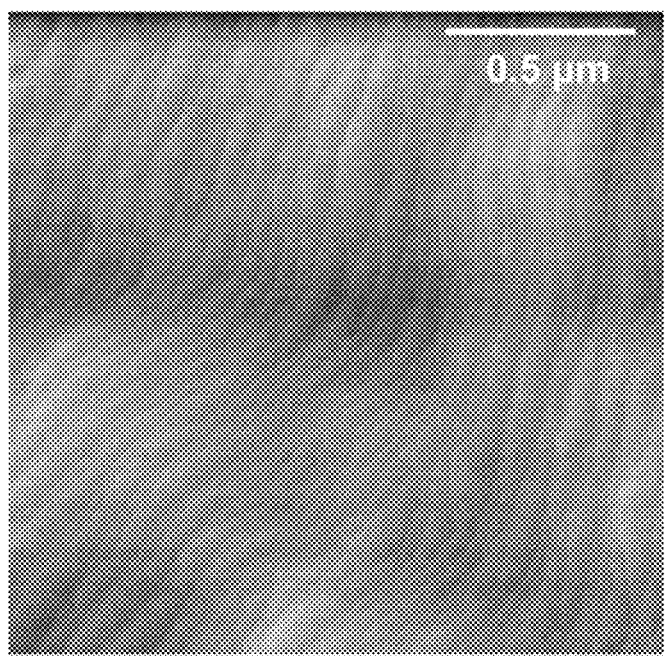

[Fig. 8]
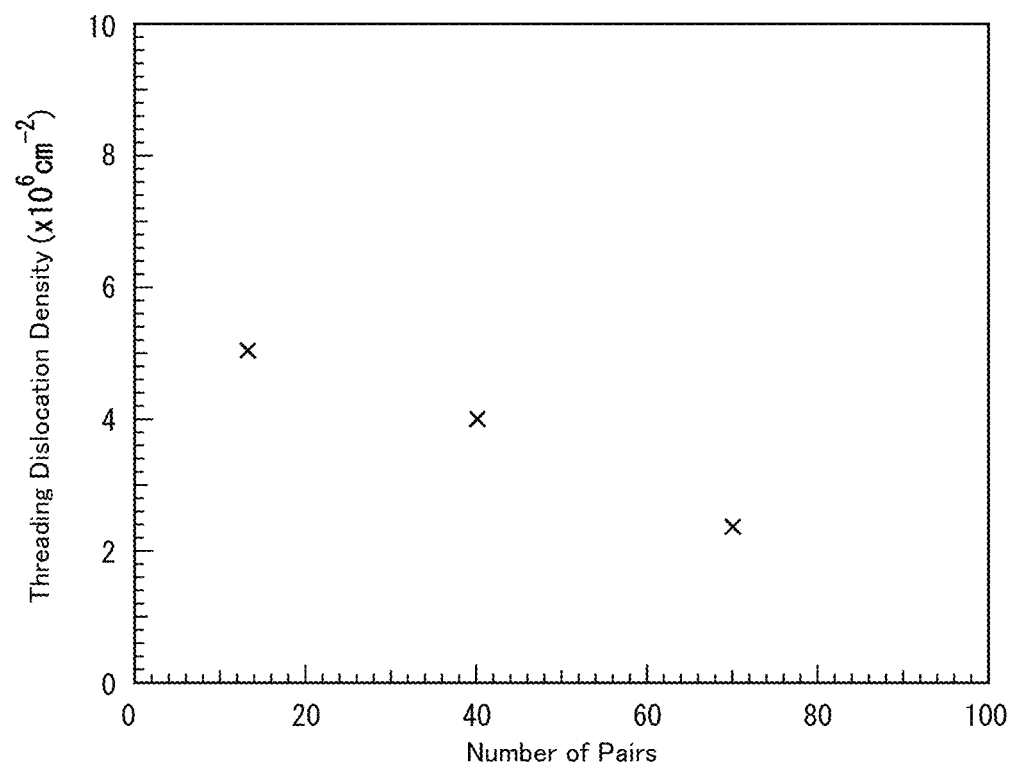

[Fig. 9]
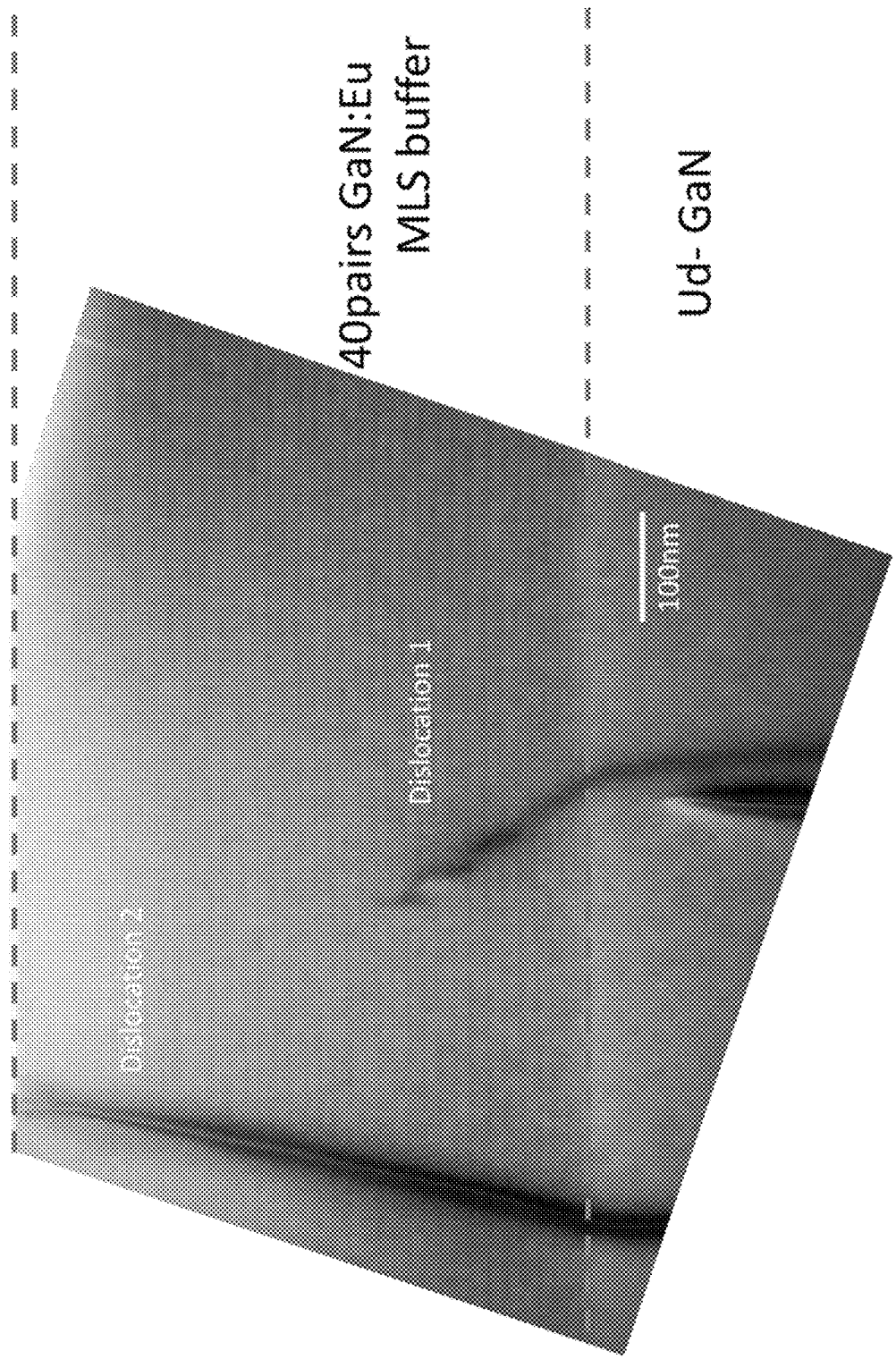

NITRIDE SEMICONDUCTOR SUBSTRATE, MANUFACTURING METHOD THEREFOR, AND SEMICONDUCTOR DEVICE

TECHNICAL FIELD

The present invention relates to a nitride semiconductor substrate having a reduced threading dislocation density on the surface, a method of manufacturing the same, and a semiconductor device manufactured using the nitride semiconductor substrate.

In recent years, light emitting devices such as light emitting diodes (LEDs) and laser diodes (LDs) have been widely used. For example, LEDs are used for various display devices, backlights of liquid crystal display devices for mobile phones and the like, white lights, etc., while LDs are used as light sources for Blu-ray Disc for recording and playback of high-definition video, optical communication, CD, DVD, etc.

Recently, applications of high-frequency devices such as MMICs (monolithic microwave integrated circuits) for mobile phones and HEMTs (high electron mobility transistors) and applications of high-power devices such as inverter power transistors for automotive related applications and Schottky-barrier diodes (SBDs) are expanding.

The semiconductor element which constitutes these devices is produced using the nitride semiconductor substrate in which a nitride semiconductor layer, such as gallium nitride (GaN), was formed. As such a nitride semiconductor substrate, a nitride semiconductor bulk substrate cut out directly from bulk single crystalline nitride, a (pseudo) nitride semiconductor bulk substrate which is formed by growing a single crystal on a base material such as sapphire and then removing the base material, and a nitride semiconductor substrate used as a template while leaving the base material on which a single crystalline nitride was grown are used.

In such a nitride semiconductor substrate, it is known that the characteristics such as the internal quantum efficiency of the LED, the oscillation performance of the LD and the lifetime are related to the threading dislocation density (TDD) of the surface of the nitride semiconductor substrate. Therefore, high quality long life semiconductor devices, especially high frequency devices and high-power devices as described above, require nitride semiconductor substrates having a threading dislocation density of $10^6$ cm$^{-2}$ or less (Non-Patent Document 1).

The nitride semiconductor substrate having a low threading dislocation density as described above can be obtained by the above described method of directly producing the nitride semiconductor bulk substrate. However, the process is complicated and costly, and the cost is 50 to 60 times as high as that in the case of producing a nitride semiconductor substrate using a sapphire base material.

Therefore, there is a strong demand for a manufacturing technique of a nitride semiconductor substrate capable of providing nitride semiconductor substrate having a low threading dislocation density at low cost using an inexpensive sapphire base material or the like.

It is known that a nitride semiconductor substrate which was produced by forming a nitride semiconductor thin film on a base material such as sapphire by metal-organic chemical vapor deposition (MOCVD) or the like has the threading dislocation density on the order of $10^8$ to $10^{10}$ cm$^{-2}$ and does not have the designed characteristics and life.

As a method for reducing the threading dislocation density, it is conceivable to increase the thickness of the nitride semiconductor layer such as GaN. However, because of difference in thermal expansion coefficient between the base material such as sapphire and the nitride such as GaN, the method has a problem that warpage occurs at the interface with the base material when the thickness of the nitride semiconductor layer is increased.

Therefore, as a method for forming a nitride semiconductor layer having a reduced threading dislocation density using a base material such as sapphire, it has been proposed that, after forming a buffer layer of nitride on a sapphire base material, amorphous silicon oxide (a-SiO$_2$) is used to form a selective area growth (SAG) mask, and lateral epitaxy is applied to form a nitride semiconductor layer on the selective area growth mask (ELOG: epitaxial lateral overgrowth) so as to reduce the threading dislocation density of the formed epitaxy layer to the order of $10^6$ to $10^7$ cm$^{-2}$.

However, this method requires the base material to be removed from the growth apparatus when forming the selective area growth mask, which complicates the process and reduces the production efficiency. In addition, since the low threading dislocation density region is formed according to the pattern of the selective area growth mask, the low threading dislocation density region is scattered on the base material. For that reason, it is impossible to increase the area, and to increase the size of the nitride semiconductor substrate.

PRIOR ART DOCUMENT

Non-Patent Document

NON-PATENT DOCUMENT 1: Kazuhito Ban et al., "Internal Quantum Efficiency of Whole-Composition-Range AlGaN Multiquantum Wells.", Appl. Phys. Express 4 (2011) 052101.

Patent Document

Patent Document 1: JP-A-2010-199620
Patent Document 2: JP-A-2015-095585

SUMMARY OF THE INVENTION

Problems to be Solved by the Invention

An object of the present invention is to provide a manufacturing technique of a nitride semiconductor substrate capable of manufacturing a nitride semiconductor substrate having a sufficiently reduced threading dislocation density with a large area, even on an inexpensive base material such as sapphire.

Means for Solving the Problems

As described above, in order to produce a high-performance long-life semiconductor device using a sapphire base material, it is necessary to produce a nitride semiconductor substrate with a controlled low threading dislocation density on the surface. However, by ELOG method, it is impossible to increase the area, and it is difficult to increase the size of the nitride semiconductor substrate.

The present inventors have succeeded in producing a red light emitting diode using a Eu-doped GaN (Eu-doped GaN layer) as a light emitting layer. In the process, the present inventors have found that the threading dislocation density is reduced in the case of a multi-layered nitride semiconductor layer formed by sequentially stacking an undoped GaN layer not doped with a doping material (ud-GaN layer) and a GaN layer doped with Eu as a doping material (Eu-doped GaN layer) on a sapphire base material.

Based on this finding, the present inventors thought that the threading dislocation density can be sufficiently reduced to enable production of a high-performance long-life semiconductor device if such a stacked structure is applied to a nitride semiconductor substrate, and has conducted various experiments and studies.

As a result, the present inventor got an amazing result below. When such a stacked structure is adopted, the threading dislocation density is dramatically reduced, and a low threading dislocation density nitride semiconductor substrate suitable for the fabrication of high-performance long-life semiconductor devices with a threading dislocation density of $10^6$ cm$^{-2}$ order or less can be obtained, even when the amount of Eu doped in the Eu-doped GaN layer is as small as an impurity level of about 1 atomic %, specifically 0.01 to 2 atomic %.

Specifically, by forming a stacked structure, it has been found that the threading dislocation density is dramatically reduced although being a nitride semiconductor substrate fabricated on the sapphire base material, because the threading dislocations from the sapphire base material bend their directions when passing through the Eu-doped GaN layer and do not reach the surface.

Further, as a result of further experiments and studies on a preferable method of stacking the ud-GaN layer and the Eu-doped GaN layer, the following findings were obtained.

That is, it has been found that, when the number of stackings is once, the threading dislocation density is reduced in proportion to the increase in the thickness of the Eu-doped GaN layer stacked on the ud-GaN layer and a nitride semiconductor substrate with sufficiently reduced threading dislocation density can be provided even when the total thickness is as thin as 3 µm or less.

On the other hand, it has been found that, when the nitride semiconductor layer is a nitride semiconductor layer having a superlattice structure by setting the number of stackings a plurality of times, the threading dislocation density is reduced in proportion to the increase in the number of stackings even if the thickness of the Eu-doped GaN layer is about 1/10 of the thickness of the ud-GaN layer. And, it has been found that, by adopting such a superlattice structure, a nitride semiconductor substrate having sufficiently reduced threading dislocation density can be provided, even when the total thickness is as thin as 3 µm or less.

And, unlike ELOG method, the ud-GaN layer and the Eu-doped GaN layer can be stacked on the entire surface of the sapphire base material, thereby the area of the nitride semiconductor layer can be made larger and the size of the object semiconductor substrate can be increased.

Reason why the threading dislocations from the sapphire base material are bent in the Eu-doped GaN layer and do not reach the surface and the threading dislocation density is reduced by forming such a stacked structure are presumed as follows.

That is, in the Eu-doped GaN layer, Eu is introduced in place of Ga, but since the atomic radius of Eu is about 1.5 times larger than that of Ga, strain is generated around Eu substituted with Ga and an amorphous part is formed. As a result, it is presumed that dislocations such as threading dislocations are not linearly propagated in the Eu-doped GaN layer, and the threading dislocation density on the surface is reduced.

Although, in the above, GaN is mentioned as the nitride and Eu is mentioned as the doped element for explanation, as the nitride, so-called GaN-type nitrides such as AlN and InN (including mixed crystals of InGaN and AlGaN, and the like) other than GaN can be mentioned in the same way. The doped element is not limited to Eu, and a rare earth element, which is collectively referred to Sc, Y and lanthanoid elements from La to Lu, can be mentioned as the doped element capable of providing a nitride semiconductor substrate with a sufficiently reduced threading dislocation density.

In addition to sapphire, SiC or Si may be used as the base material, and thin GaN may be used as the base material. Since SiC is inexpensive and has high thermal conductivity and excellent heat dissipation, a nitride semiconductor substrate suitable for manufacturing high power semiconductor devices can be provided at low cost. And, since a base material of a large size can be easily obtained from Si, an enlarged nitride semiconductor substrate can be provided. In addition, by using thin GaN as a base material, a GaN bulk base material can be provided at low cost.

As described above, according to the present technique, in the nitride semiconductor substrate in which the nitride semiconductor layer is formed on the base material, when two or more nitride layers having different local strains are alternated to form the nitride semiconductor layers having a stacked structure, at least a part of the dislocation from the base material side is bent and disappears before reaching the surface. As a result, there is provided a nitride semiconductor substrate in which the threading dislocation density on the surface of the nitride semiconductor layer is reduced to $10^6$ cm$^{-2}$ order or less, which is considered to be suitable for producing high-performance long-life semiconductor devices.

Moreover, when the nitride semiconductor layer formed on the base material is removed from the base material, the removed nitride semiconductor layer can be used as a nitride semiconductor bulk substrate.

The inventions set forth in claims 1 to 14 are based on the above findings.

The invention set forth in claim 1 is a nitride semiconductor substrate in which a nitride semiconductor layer is formed on a base material, wherein the nitride semiconductor layer is formed by stacking an undoped nitride layer to which doping material is not doped and a rare earth element-doped nitride layer to which a rare earth element is doped as a doping material, and the threading dislocation density on the surface of the nitride semiconductor layer is at the order of $10^6$ cm$^{-2}$ or less.

The invention set forth in claim 2 is the nitride semiconductor substrate according to claim 1, wherein the nitride in the nitride semiconductor layer is GaN, InN, AlN or a mixed crystal of any two or more of them.

The invention set forth in claim 3 is the nitride semiconductor substrate according to claim 1 or 2, wherein the rare earth element is Eu.

The invention set forth in claim 4 is the nitride semiconductor substrate according to claim 3, wherein the doped amount of Eu is 0.01 to 2 atomic %.

The invention set forth in claim 5 is the nitride semiconductor substrate according to any one of claims 1 to 4, wherein
the number of stackings of the undoped nitride layer and the rare earth element-doped nitride layer is once, the thickness of the undoped nitride layer is 0.1 to 50 nm, and the thickness of the rare earth element-doped nitride layer is 0.1 to 2000 nm.

The invention set forth in claim 6 is the nitride semiconductor substrate according to any one of claims 1 to 4, wherein
the undoped nitride layer and the rare earth element-doped nitride layer are stacked a plurality of times to form the nitride semiconductor layer with a super lattice structure, the thickness of the nitride layer is 0.1 to 50 nm, and the thickness of the rare earth element doped nitride layer is 0.1 to 200 nm.

The invention set forth in claim 7 is the nitride semiconductor substrate according to claim 6, wherein the number of times of stacking is 2 to 300 times.

The invention set forth in claim 8 is the nitride semiconductor substrate according to any one of claims 1 to 7, wherein the total thickness is 3 μm or less.

The invention set forth in claim 9 is the nitride semiconductor substrate according to any one of claims 1 to 8, wherein the base material is any one of sapphire, SiC, Si and GaN.

The invention set forth in claim 10 is a nitride semiconductor substrate in which a nitride semiconductor layer is formed on a base material, wherein
the nitride semiconductor layer has a structure where two or more nitride layers different in local strain are stacked alternately, and the threading dislocation density on the surface of the nitride semiconductor layer is not more than $10^6$ cm$^{-2}$ orders.

The invention set forth in claim 11 is the nitride semiconductor substrate according to claim 10, wherein
at least a part of the dislocations from the base material side is bent in the alternately stacked structure of the nitride semiconductor layers and disappears before reaching the surface.

The invention set forth in claim 12 is the nitride semiconductor substrate according to claim 10 or 11, wherein the nitride semiconductor layer is removed from the base material and is formed as a nitride semiconductor bulk substrate.

And, because the nitride semiconductor substrate according to the present invention described above is a nitride semiconductor substrate with a sufficiently reduced threading dislocation density, it can be suitably used not only for light emitting devices but also for high frequency devices and high-power devices.

That is, the invention set forth in claim 13 is a semiconductor device which is produced using the nitride semiconductor substrate according to any one of claims 1 to 12.

The invention set forth in claim 14 is the semiconductor device according to claim 13, which is any one of a light emitting device, a high frequency device, and a high power device.

The nitride semiconductor substrate according to the present invention described above can be manufactured by stacking an undoped nitride layer to which no doping material is doped and a rare earth element-doped nitride layer to which a rare earth element such as Eu is doped as a doping material on a base material such as sapphire in a series of steps without taking it out of the reaction vessel at a temperature condition of 900 to 1200° C. using metalorganic vapor phase epitaxy (OMVPE).

During the nitride layer growth, when the growth temperature is increased, pits (holes) due to dislocations penetrating to the surface become large, and the threading dislocation density cannot be sufficiently reduced. On the other hand, when the temperature is lowered, the pits become smaller and the threading dislocation density can be sufficiently reduced.

Therefore, in the present invention, the growth temperature of the nitride layer is set to 900 to 1100° C. Under such temperature conditions, it is possible to make smaller the pits due to dislocations that pass through the rare earth element-doped nitride layer and reaches the surface. Further, Ga, Al or In forming a nitride can be reliably substituted with a rare earth element to be doped such as Eu. As a result, a nitride semiconductor substrate with sufficiently reduced threading dislocation density can be manufactured.

And since the formation of the undoped nitride layer or the rare earth element-doped nitride layer can be performed depending on whether or not Eu or the like is doped during the growth of the GaN crystal, the formation can be performed in a series of steps without taking it out of the reaction vessel. Thus, a large-sized nitride semiconductor substrate can be manufactured inexpensively with high production efficiency.

That is, the invention set forth in claim 15 is a manufacturing method for a nitride semiconductor substrate in which a nitride semiconductor layer is formed on abase material, having
a step of forming an undoped nitride layer to which the doping material is not doped by growing a crystal of GaN, InN or AlN, or a mixed crystal of any two or more of them on the base material, and
a step of forming a rare earth element-doped nitride layer on the undoped nitride layer by growing a crystal of GaN, InN or AlN, or a mixed crystal of any two or more of them, and doping a rare earth element as a doping material so as to substitute Ga, In or Al; wherein
the two steps are conducted in a series of forming steps without taking it out of the reaction vessel under a temperature condition of 900 to 1200° C. by an organometallic vapor phase epitaxy.

And the invention set forth in claim 16 is the manufacturing method for a nitride semiconductor substrate according to claim 15, wherein the step of forming the undoped nitride layer and the step of forming the rare earth element-doped nitride layer are alternately repeated plural times.

As described above, by repeating the stacking to form a nitride semiconductor layer having a superlattice structure, it is possible to manufacture a nitride semiconductor substrate having a sufficiently reduced threading dislocation density while having a total thickness of 3 μm or less.

The invention set forth in claim 17 is the manufacturing method for a nitride semiconductor substrate according to claim 15 or 16, wherein Eu is used as the rare earth element.

Among the lanthanoid rare earth elements, Eu has an atomic radius suitable for causing distortion in the periphery and suppressing the propagation of dislocations when substituted with Ga, so that the threading dislocation density on the surface can be efficiently reduced.

In addition, Eu is preferable as a doping material because the Eu compound is easily available.

The invention set forth in claim 18 is the manufacturing method for a nitride semiconductor substrate according to claim 17, wherein Eu is provided from any one selected from Eu{N[Si(CH$_3$)$_3$]$_2$}$_3$, Eu(C$_{11}$H$_{19}$O$_2$)$_3$ and Eu[C$_5$(CH$_3$)$_4$(C$_3$H$_7$)]$_2$.

Specific example of Eu sources include Eu[C$_5$(CH$_3$)$_5$]$_2$, Eu[C$_5$(CH$_3$)$_4$H]$_2$, Eu{N [Si(CH$_3$)$_3$]$_2$}$_3$, Eu(C$_5$H$_7$O$_2$)$_3$, Eu(C$_{11}$H$_{19}$O$_2$)$_3$, Eu[C$_5$CH$_3$)$_4$(C$_3$H$_7$)]$_2$ and the like. Of these, Eu{N[Si (CH$_3$)$_3$]$_2$}$_3$, Eu(C$_{11}$H$_{19}$O$_2$)$_3$ and Eu[C$_5$(CH$_3$)$_4$(C$_3$H$_7$)]$_2$ have a high vapor pressure in the reactor and efficient doping can be performed.

The invention set forth in claim 19 is the manufacturing method for a nitride semiconductor substrate according to any one of claims 15 to 18, wherein any one of sapphire, SiC, Si and GaN is used as the base material.

The invention set forth in claim 20 is the manufacturing method for a nitride semiconductor substrate according to any one of claims 15 to 19 which further comprises a step of removing the nitride semiconductor layer formed on the base material from the base material to obtain a nitride semiconductor bulk substrate.

The nitride semiconductor layer can be used as a nitride semiconductor bulk substrate by removing the nitride semiconductor layer formed on the base material from the base material.

Effect of the Invention

According to the present invention, there is provided a manufacturing technique of a nitride semiconductor substrate capable of manufacturing a nitride semiconductor substrate of a large area with a sufficiently reduced threading dislocation density, even on an inexpensive base material such as sapphire.

BRIEF DESCRIPTION OF THE DRAWINGS

FIG. 1 A schematic diagram showing the configuration of the nitride semiconductor substrate according to an embodiment of the present invention.

FIG. 2 A TEM image of the nitride semiconductor substrate according to an embodiment of the present invention.

FIG. 3 AFM images of the surface of the nitride semiconductor substrate according to an embodiment of the present invention.

FIG. 4 AFM images of the surface of the Eu-doped GaN layer in the nitride semiconductor substrate according to an embodiment of the present invention.

FIG. 5 A TEM image observing the cross section of the nitride semiconductor substrate from a specific direction according to an embodiment of the present invention.

FIG. 6 A schematic diagram showing the configuration of the nitride semiconductor substrate according to another embodiment of the present invention.

FIG. 7 An AFM image of the surface of the nitride semiconductor substrate according to another embodiment of the present invention.

FIG. 8 A figure showing the relationship of the number of times of stacking and the threading dislocation density in the nitride semiconductor substrate according to another embodiment of the present invention.

FIG. 9 A TEM image of the nitride semiconductor substrate according to another embodiment of the present invention.

EMBODIMENT FOR CARRYING OUT THE INVENTION

Hereinafter, the present invention will be described based on the embodiments. In the following description, sapphire is used as the base material, GaN layer is used as the nitride semiconductor layer, and Eu is used as the rare earth element to be doped. However, as described above, the present invention is not limited to these.

[1] First Embodiment

The present embodiment is a nitride semiconductor substrate, wherein an undoped nitride layer (ud-GaN layer) and a rare earth element-doped nitride layer (Eu-doped GaN layer) in which Eu is doped as a rare earth element are stacked one by one on a sapphire base material to form a nitride semiconductor layer. The nitride semiconductor substrate of the present embodiment will be described below.

1. Basic Configuration of the Nitride Semiconductor Substrate

First, the basic configuration of the nitride semiconductor substrate according to the present embodiment will be described. FIG. 1 is a schematic view showing a configuration of a nitride semiconductor substrate according to the present embodiment. In FIG. 1, reference numeral 1 denotes a nitride semiconductor substrate, 10 denotes a sapphire base material, and 20 denotes a nitride semiconductor layer where the ud-GaN layer 21 and the Eu-doped GaN layer 22 are stacked once as a pair.

The nitride semiconductor substrate according to the present embodiment may be used as a template for the production of a semiconductor device while forming the nitride semiconductor layer on a sapphire base material, in which the nitride semiconductor layer functions as a buffer layer. Hence, the nitride semiconductor layer may be expressed as a buffer layer in some case.

Then, in the present embodiment, as shown in FIG. 1, between the sapphire base material 10 and the nitride semiconductor layer 20,
LT-GaN layer 30 grown at a low temperature of about 475° C. in order to prevent the occurrence of cracks due to the difference of the lattice constant (lattice mismatch) between the sapphire base material 10 and GaN, and ud-GaN layer 40 for suppressing the influence of dislocations, by increasing the distance between the sapphire base material 10 and the nitride semiconductor layer (buffer layer) 20 are formed in advance.

2. Method of Manufacturing Nitride Semiconductor Substrate

Next, the method of manufacturing a nitride semiconductor substrate according to the present embodiment will be described specifically with an example of producing a nitride semiconductor substrate 1 by stacking an ud-GaN layer 21 with a thickness of 10 nm and an Eu-doped GaN layer 22 with a thickness of 300 nm.

First, by metalorganic vapor phase epitaxy (OMVPE), an LT-GaN layer 30 with a thickness of about 30 nm is grown on sapphire base material 10 under conditions of a growth temperature of 475° C. and a pressure of 100 kPa at a growth rate of 1.3 μm/h, and then an ud-GaN layer 40 with a thickness of about 2 μm was formed on the LT-GaN layer 30 under conditions of a growth temperature of 1150° C. and a pressure of 100 kPa at a growth rate of 0.8 μm/h.

Next, by the OMVPE similarly, Eu-doped GaN layer 22 with a thickness of 300 nm was formed on the ud-GaN layer 40 under conditions of a growth temperature of 960° C. and a pressure of 100 kPa at a growth rate of 0.8 μm/h.

Next, by OMVPE similarly, an ud-GaN layer 21 with a thickness of 10 nm was formed on the Eu-doped GaN layer 22 under conditions of a growth temperature of 960° C. and a pressure of 100 kPa at a growth rate of 0.8 μm/h.

Thus, the nitride semiconductor layer 20 was formed by stacking the Eu-doped GaN layer 22 and the ud-GaN layer 21 one by one, and the manufacture of the nitride semiconductor substrate 1 was completed.

In the above, trimethylgallium (TMGa) was used as the Ga source material, and the supply amount was 0.55 sccm. Then, ammonia ($NH_3$) was used as the N source material, and the supply amount was 4.0 slm. In addition, $Eu[C_5(CH_3)_4 (C_3H_7)]_2$ bubbled with a carrier gas (hydrogen gas:

H$_2$) was used as the Eu organic raw material, and the supply amount was 1.5 slm (supply temperature: 115° C.).

At this time, by changing the piping valve etc. of the OMVPE apparatus from the one with normal specification (heat resistant temperature 80 to 100° C.) to the one with high temperature special specification, the temperature for supplying Eu raw material was kept at a sufficiently high temperature of 115 to 135° C. in order to supply a sufficient amount of Eu to the reaction tube.

In the present embodiment, the formation of each layer was performed in a series of steps so as not to interrupt the growth without taking the sample out of the reaction tube halfway.

3. Evaluation of Threading Dislocation Density (1) Evaluation Based on TEM Image Regarding the threading dislocation density on the surface of the nitride semiconductor substrate obtained above, first, the cross section is observed by a transmission electron microscope (TEM) to evaluate the effect of threading dislocation density reduction.

FIG. 2 is a TEM image of a nitride semiconductor substrate. From FIG. 2, it can be seen that in this nitride semiconductor substrate, dislocations generated in the ud-GaN layer formed on the sapphire base material at the lower-most are propagated toward the surface. However, among these dislocations, although the dislocations reach the surface in the portion encircled by the dark dashed dotted line on the right side, the dislocations disappear, in the portion encircled by the light dashed dot line on the left, before reaching the surface in the stacked nitride semiconductor layer (buffer layer) in which an ud-GaN layer and an Eu-doped GaN layer are stacked. From this result, it can be confirmed that the threading dislocation density can be reduced in the nitride semiconductor substrate according to the present embodiment.

(2) Evaluation Based on AFM Image

Next, the state of dislocations appearing on the surface before and after the formation of the nitride semiconductor layer (buffer layer) was observed with an atomic force microscope (AFM) to evaluate the effect of the threading dislocation density reduction. The observation was conducted at the same position of 1 µm square.

FIG. 3 is AFM images of the surface of the nitride semiconductor substrate, where (a) is the surface of the ud-GaN layer before the formation of the nitride semiconductor layer (buffer layer), (b) is the surface of the nitride semiconductor layer (buffer layer) after the formation of the nitride semiconductor layer (buffer layer).

As shown in FIG. 3 (a), on the surface of the ud-GaN layer, dislocation-based pits are present at many places surrounded by circles, and the diameters of the pits are large. On the other hand, on the surface of the nitride semiconductor layer (buffer layer), as shown in FIG. 3 (b), only a few pits exist in a wide part surrounded by circles of alternate long and short dash line and the diameters of the pits are smaller.

From this result, it can be confirmed that the threading dislocation density can be reduced in the nitride semiconductor substrate according to the present embodiment, similar to the result as described above. The reason why the diameter of the pits becomes has smaller is considered that the diameter of the pits formed in the GaN layer is related to the growth temperature, and the growth of the Eu-doped GaN layer to be the upper layer was performed at a low temperature of 960° C., thereby the diameter of the pits has become smaller. When the diameter of the pits becomes smaller and the pits are closed, the threading dislocation density is further reduced.

Specifically, when the threading dislocation density was measured, it was $10^8$ to $10^9$ order in FIG. 3 (a), but it was reduced to $10^6$ order in FIG. 3 (b).

(3) Relationship between Thickness of Eu-Doped GaN Layer and Threading Dislocation Density Further, in order to evaluate the relationship between thickness of Eu-doped GaN layer and threading dislocation density, on an ud-GaN layer with a thickness of 10 nm, an Eu-doped GaN layer was grown to a thickness of 900 nm according to the same manner as above, and how the thickness affected the threading dislocation density was evaluated.

Specifically, when the thickness of the Eu-doped GaN layer reached 100 nm, 300 nm, and 900 nm, the appearance of dislocations appearing on the surface was observed by AFM according to the same manner as described above.

FIG. 4 is AFM images of the surface of the Eu-doped GaN layer of each thickness, where (a) corresponds to thickness of 100 nm, (b) corresponds to thickness of 300 nm, and (c) corresponds to thickness of 900 nm.

It can be seen from FIG. 4 that as the thickness of the Eu-doped GaN layer increases, the pits decrease as shown by encircled by a circle of alternate long and short dash line, and disappear almost at a thickness of 900 nm.

Specifically, when the threading dislocation density is measured, it is $10^8$ order in FIG. 4 (a), it is $10^7$ order in FIG. 4 (b), and it is $10^6$ order in FIG. 4 (c). It has been confirmed from the result that the threading dislocation density is reduced dramatically as the thickness increases.

(4) Propagation of Threading Dislocation Density in the Present Embodiment

Here, propagation of the threading dislocation density in the present embodiment will be described with reference to FIG. 5. FIG. 5 is TEM images obtained by observing the cross section of the nitride semiconductor substrate manufactured above from a specific direction, specifically, upward g=[002] and g=[110]. Each is shown arranged up and down.

In FIG. 5, the direction of g=[002] is a direction for determining screw dislocation, and the direction of g=[110] is a direction for determining edge dislocation. However, as can be seen from FIG. 5, in addition to these dislocations, several dislocations appear as mixed dislocations in both the direction of g=[002] and the direction of g=[110]. The growth and disappear of the mixed dislocations are controlled by the nitride semiconductor layer (buffer layer).

Specifically, in FIG. 5, when the mixed dislocations propagate to the Eu-doped GaN layer of the nitride semiconductor layer (buffer layer), first, the screw dislocations converge and disappear, and then the vector of edge dislocations (edge vector) is converged, thereby the two mixed dislocations disappear without reaching the surface at the portion surrounded by the white oval of alternate long and short dash line.

4. Effect of the Present Embodiment

As described above, in the present embodiment, a nitride semiconductor substrate having a sufficiently low threading dislocation density of $10^6$ cm$^{-2}$ or less can be obtained, by a simple method of stacking the ud-GaN layer and the Eu-doped GaN layer once with appropriate thicknesses on an inexpensive sapphire base material. Therefore, the present embodiment is able to suitably meet the recent demand for inexpensively providing high-performance, long-life semiconductor devices.

[2] Second Embodiment

In the above-described first embodiment, the threading dislocation density can be reduced according to the increase in the thickness of the Eu-doped GaN layer stacked on the ud-GaN layer. However, if the Eu-doped GaN layer is too thick, there is a risk that warpage occurs at the interface between the sapphire and the nitride semiconductor layer, due to a difference in thermal expansion coefficient between the sapphire as the base material and the GaN of the nitride semiconductor layer, thereby the product cannot be used as a nitride semiconductor substrate.

Therefore, in the present embodiment, stacking the ud-GaN layer and the Eu-doped GaN layer alternately is repeated a plurality of times to form multiple pairs of the ud-GaN layer and the Eu-doped GaN layer on the sapphire base material and to form a nitride semiconductor layer having a superlattice structure, thereby a thin nitride semiconductor substrate with sufficiently reduced threading dislocation density can be manufactured.

1. Basic Configuration of Nitride Semiconductor Substrate

First, the basic configuration of the nitride semiconductor substrate according to the present embodiment will be described. FIG. 6 is a schematic view showing the configuration of the nitride semiconductor substrate according to the present embodiment. The reference numerals in FIG. 6 are the same as in FIG. 1 except that the number of nitride semiconductor substrates is 2. As can be seen from FIG. 6, in the present embodiment, the configuration is the same as that of the nitride semiconductor substrate according to the first embodiment except that the nitride semiconductor layer 20 is formed by alternately stacking an Eu-doped GaN layer 22 and an ud-GaN layer 21 a plurality of times and the ud-GaN layer 21 is formed on the outermost layer from the viewpoint of suppressing oxidation.

2. Manufacturing Method for Nitride Semiconductor Substrate

Also the manufacturing method for a nitride semiconductor substrate 2 according to the present embodiment is the same as the nitride semiconductor substrate manufacturing method according to the first embodiment, except that an ud-GaN layer 21 and an Eu-doped GaN layer 22 are repeatedly formed and the plurality of pairs of the ud-GaN layer 21 and the Eu-doped GaN layer 22 are stacked. In the present embodiment, the formation of each layer was performed in a series of steps so as not to interrupt the growth without taking the sample out of the reaction tube halfway.

3. Evaluation of Threading Dislocation Density (1) Evaluation Based on AFM Image By the manufacturing method for a nitride semiconductor substrate described above, the ud-GaN layer 21 with a thickness of 10 nm and the Eu-doped GaN layer 22 with a thickness of 1 nm are alternately stacked 40 times (40 pairs) to fabricate a nitride semiconductor substrate 2. Effect of the threading dislocation density reduction for the nitride semiconductor substrate 2 was evaluated based on the AFM image, as in the first embodiment.

FIG. 7 is an AFM image of the surface of the nitride semiconductor substrate. Comparing this FIG. 7 with FIG. 4 (c) which is an AFM image of the surface of a nitride semiconductor substrate in which an Eu-doped GaN layer with a thickness of 900 nm is stacked once, it can be seen that the threading dislocation density is reduced further, although the total thickness (including the outermost ud-GaN layer) is 480 nm which is about half the thickness compared with FIG. 4 (c).

From this result, it has been confirmed that, according to the present embodiment, the threading dislocation density can be reduced dramatically, even though the total thickness is thin, by stacking a plurality of times to form a nitride semiconductor layer having a superlattice structure, thereby the dislocations being bent in each Eu-doped GaN layer.

(2) Influence of Number of Pairs (Number of Stackings) on Reduction of Threading Dislocation Density Next, in order to investigate the influence of number of pairs (number of stackings) on reduction of threading dislocation density, by the above-described manufacturing method for a nitride semiconductor substrate, an ud-GaN layer 21 with a thickness of 10 nm and Eu-doped GaN layer 22 with a thickness of 3 nm were stacked alternately and fabricates three kinds of nitride semiconductor substrates 2, in each of which a nitride semiconductor layers was formed, while the number of pairs (the number of stacking) was changed to 13 (experiment A), 40 (experiment B) and 70 (experiment C). Threading Dislocation density in Each of the nitride semiconductor substrates 2 thus fabricated was measured.

The measurement results are shown in Table 1 and in FIG. 8. In FIG. 8, the horizontal axis represents the number of pairs, and the vertical axis represents threading dislocation density ($\times 10^6$ cm$^{-2}$). Further, a cross-sectional TEM image of a nitride semiconductor substrate manufactured by stacking the 40 pairs in Experiment B is shown in FIG. 9.

| | Nitride Semiconductor Layer (MLS) | | | Threading |
|---|---|---|---|---|
| | Thickness of Eu-doped GaN Layer | Thickness of ud-Gan Layer | Number of Pairs | Dislocation Density (cm$^{-2}$) |
| Experiment A | 3 nm | 10 nm | 13 | $5 \times 10^6$ |
| Experiment B | 3 nm | 10 nm | 40 | $4 \times 10^6$ |
| Experiment C | 3 nm | 10 nm | 70 | $2.4 \times 10^6$ |

From Table 1 and FIG. 7, it is understood that the threading dislocation density is on the order of $10^6$ cm$^{-2}$ even with the smallest number of pairs of 13 pairs, and the threading dislocation density is reduced as the number of pairs increases.

Two dislocations, Dislocation 1 and Dislocation 2, exist in FIG. 9, Dislocations 1 are converged and disappeared after entering the nitride semiconductor layer (buffer layer). On the other hand, Dislocations 2 do not disappear, but the size of dislocations decreases as it passes through the pair. From this result in Table 1 and FIG. 7, it can be understood also that the threading dislocation density is further reduced in Experiment C in which the number of pairs is further increased to 70 pairs.

Further, the above results satisfy the threading dislocation density ($10^6$ cm$^{-2}$ order) required in the case of producing a pickup with blue laser or a vertical power transistor using Si, SiC or the like. Therefore, it can be seen that the nitride semiconductor substrate according to the present embodiment can be used for manufacturing a blue laser for pickup used in Blu-Ray and a vertical power transistor, although it is formed on a sapphire base material.

In addition, since the threading dislocation density is reduced as the number of pairs is increased, it is expected that $10^4$ cm$^{-2}$ order required for the blue laser for writing used in Blu-Ray can be achieved by further increasing the number of pairs to further reduce the threading dislocation density.

As described above, according to the present invention, as shown in the first embodiment and the second embodiment, a nitride semiconductor substrate can be provided which enables production of a high quality nitride semiconductor using an inexpensive sapphire base material or the like. In addition, since the nitride layer can be formed on the entire surface of the base material, the area can be increased and the practicability is excellent.

And since a nitride semiconductor bulk substrate can be obtained by removing the base material from the above-described nitride semiconductor substrate, utilization may spread further as a nitride semiconductor substrate for semiconductor devices.

As described above, although the present invention was explained based on the embodiments, the present invention is not limited to the above-described embodiments. Various modifications can be made to the above embodiments within the same and equivalent scope of the present invention.

DESCRIPTION OF THE REFERENCE NUMERALS 1, 2 Nitride semiconductor substrate
10 Sapphire base material
20 Nitride semiconductor layer (buffer layer)
21 ud-GaN layer
22 Eu-doped GaN layer
30 LT-GaN layer
40 ud-GaN layer

What is claimed is:

1. A nitride semiconductor substrate in which a nitride semiconductor layer is formed on a base material, wherein
an undoped nitride layer having the thickness of 0.1 to 50 nm to which doping material is not doped and
a rare earth element-doped nitride layer having the thickness of 0.1 to 2000 nm to which a rare earth element is doped as a doping material
are stacked once to form the nitride semiconductor layer, and the threading dislocation density on the surface of the nitride semiconductor layer is at the order of $10^6$ cm$^{-2}$ or less.

2. The nitride semiconductor substrate according to claim 1, wherein the nitride in the nitride semiconductor layer is GaN, InN, AlN or a mixed crystal of any two or more of them.

3. The nitride semiconductor substrate according to claim 1, wherein the rare earth element is Eu.

4. The nitride semiconductor substrate according to claim 3, wherein the doped amount of the Eu is 0.01 to 2 atomic %.

5. The nitride semiconductor substrate according to claim 1, wherein the total thickness is 3 μm or less.

6. The nitride semiconductor substrate according to claim 1, wherein the base material is any one of sapphire, SiC, Si and GaN.

7. A semiconductor device which is produced using the nitride semiconductor substrate according to claim 1.

8. The semiconductor device according to claim 7, which is any one of a light emitting device, a high frequency device, and a high power device.

9. A nitride semiconductor substrate in which a nitride semiconductor layer is formed on a base material, wherein
an undoped nitride layer having the thickness of 0.1 to 50 nm to which doping material is not doped and
a rare earth element-doped nitride layer having the thickness of 0.1 to 200 nm to which a rare earth element is doped as a doping material
are stacked a plurality of times to form the nitride semiconductor layer with a super lattice structure, and
the threading dislocation density on the surface of the nitride semiconductor layer is at the order of $10^6$ cm$^{-2}$ or less.

10. The nitride semiconductor substrate according to claim 9, wherein the number of times of stacking is 2 to 300 times.

11. A nitride semiconductor substrate in which a nitride semiconductor layer is formed on a base material, wherein
the nitride semiconductor layer has a structure where
an undoped nitride layer having the thickness of 0.1 to 50 nm and a rare earth element-doped nitride layer having the thickness of 0.1 to 2000 nm, which are different in local strain, are stacked once alternately, and
the threading dislocation density on the surface of the nitride semiconductor layer is not more than $10^6$ cm$^{-2}$ orders.

12. The nitride semiconductor substrate according to claim 11, wherein
at least a part of the dislocations from the base material side is bent in the alternately stacked structure of the nitride semiconductor layers and disappears before reaching the surface.

13. The nitride semiconductor substrate according to claim 11, wherein the nitride semiconductor layer is removed from the base material and is formed as a nitride semiconductor bulk substrate.

14. A nitride semiconductor substrate in which a nitride semiconductor layer is formed on a base material, wherein
the nitride semiconductor layer has a super lattice structure where an undoped nitride layer having the thickness of 0.1 to 50 nm and a rare earth element-doped nitride layer having the thickness of 0.1 to 200 nm, which are different in local strain, are stacked alternately a plurality of times, and
the threading dislocation density on the surface of the nitride semiconductor layer is not more than $10^6$ cm$^{-2}$ orders.

15. A manufacturing method for a nitride semiconductor substrate in which a nitride semiconductor layer is formed on a base material, having
a step of forming an undoped nitride layer having the thickness of 0.1 to 50 nm to which the doping material is not doped by growing a crystal of GaN, InN or AlN or a mixed crystal of any two or more of them on the base material, and
a step of forming a rare earth element-doped nitride layer having the thickness of 0.1 to 2000 nm on the undoped nitride layer by growing a crystal of GaN, InN or AlN, or a mixed crystal of any two or more of them, and doping a rare earth element as a doping material so as to substitute Ga, In or Al; wherein
the two steps are conducted in a series of forming steps without taking it out of the reaction vessel under a temperature condition of 900 to 1200° C. by an organometallic vapor phase epitaxy.

16. The manufacturing method for a nitride semiconductor substrate according to claim 15, wherein Eu is used as the rare earth element.

17. The manufacturing method for a nitride semiconductor substrate according to claim 16, wherein Eu is provided from any one selected from Eu{N[Si(CH$_3$)$_3$]$_2$}$_3$, Eu(C$_{11}$H$_{19}$O$_2$)$_3$ and Eu[C$_5$(CH$_3$)$_4$(C$_3$H$_7$)]$_2$.

18. The manufacturing method for a nitride semiconductor substrate according to claim 15, wherein any one of sapphire, SiC, Si and GaN is used as the base material.

19. The manufacturing method for a nitride semiconductor substrate according to claim 15 which further comprises a step of removing the nitride semiconductor layer formed on the base material from the base material to obtain a nitride semiconductor bulk substrate.

20. A manufacturing method for a nitride semiconductor substrate in which a nitride semiconductor layer is formed on a base material, having a step of forming an undoped nitride layer to which the doping material is not doped by growing a crystal of GaN, InN or AlN or a mixed crystal of any two or more of them on the base material, and a step of forming a rare earth element-doped nitride layer having the thickness of 0.1 to 200 nm on the undoped nitride layer by growing a crystal of GaN, InN or AlN or a mixed crystal of any two or more of them, and doping a rare earth element as a doping material so as to substitute Ga, In or Al; wherein the two steps are conducted in a series of forming steps without taking it out of the reaction vessel under a temperature condition of 900 to 1200° C. by an organometallic vapor phase epitaxy and are alternately repeated plural times.

\* \* \* \* \*